(12) United States Patent
Choi (10) Patent No.: US 12,451,410 B2
(45) Date of Patent: Oct. 21, 2025

(54) SEMICONDUCTOR PACKAGE MODULE INCLUDING VERTICAL TERMINALS

(71) Applicant: JMJ Korea Co., Ltd., Busan (KR)

(72) Inventor: Yun Hwa Choi, Busan (KR)

(73) Assignee: JMJ Korea Co., Ltd., Busan (KR)

( * ) Notice: Subject to any disclaimer, the term of this patent is extended or adjusted under 35 U.S.C. 154(b) by 464 days.

(21) Appl. No.: 18/109,190

(22) Filed: Feb. 13, 2023

(65) Prior Publication Data

US 2023/0326830 A1    Oct. 12, 2023

(30) Foreign Application Priority Data

Apr. 11, 2022    (KR) .................. 10-2022-0044768

(51) Int. Cl.
| | | |
|---|---|---|
| *H01L 23/433* | (2006.01) | |
| *H01L 23/31* | (2006.01) | |
| *H01L 23/373* | (2006.01) | |
| *H01L 23/495* | (2006.01) | |
| *H01L 23/498* | (2006.01) | |
| *H01L 23/538* | (2006.01) | |
| *H01L 25/065* | (2023.01) | |
| *H01L 23/00* | (2006.01) | |

(52) U.S. Cl.
CPC ...... *H01L 23/4334* (2013.01); *H01L 23/3107* (2013.01); *H01L 23/3121* (2013.01); *H01L 23/3735* (2013.01); *H01L 23/49568* (2013.01); *H01L 23/49575* (2013.01); *H01L 23/49838* (2013.01); *H01L 23/5381* (2013.01); *H01L 25/0652* (2013.01); *H01L 24/46* (2013.01); *H01L 24/49* (2013.01); *H01L 24/97* (2013.01); *H01L 2924/181* (2013.01)

(58) Field of Classification Search
CPC ............ H01L 23/3735; H01L 23/4334; H01L 23/3121; H01L 23/49568; H01L 23/49575; H01L 23/3107; H01L 23/49838; H01L 23/5381; H01L 2924/181; H01L 24/49; H01L 24/46; H01L 24/97; H01L 25/0652
See application file for complete search history.

(56) References Cited

U.S. PATENT DOCUMENTS

| | | | | |
|---|---|---|---|---|
| 8,860,196 | B2 * | 10/2014 | Eom ................... | H01L 25/0655 257/679 |
| 2022/0399300 | A1 * | 12/2022 | Choi ..................... | H01L 24/32 |
| 2023/0282566 | A1 * | 9/2023 | Choi ..................... | H01L 24/29 |

FOREIGN PATENT DOCUMENTS

| | | |
|---|---|---|
| JP | H05-206693 A | 8/1993 |
| JP | H07-058277 A | 3/1995 |
| JP | 2020-047658 A | 3/2020 |
| JP | 6738968 B1 | 8/2020 |
| KR | 10-2001-0111736 A | 12/2001 |
| KR | 10-0867573 B1 | 11/2008 |
| KR | 10-2012-0079325 A | 7/2012 |

\* cited by examiner

*Primary Examiner* — Alonzo Chambliss
(74) *Attorney, Agent, or Firm* — Park, Kim & Suh, LLC (57) ABSTRACT

Provided is a semiconductor package module including vertical terminals in which the vertical terminals are connected to increase the number of terminals, problems on bending of the terminals may be solved while in electrical connection, and resistance of electrical signals may be reduced.

20 Claims, 11 Drawing Sheets

SEMICONDUCTOR PACKAGE MODULE INCLUDING VERTICAL TERMINALS

CROSS-REFERENCE TO RELATED PATENT APPLICATION

This application claims the benefit of Korean Patent Application No. 10-2022-0044768, filed on Apr. 11, 2022, in the Korean Intellectual Property Office, the disclosure of which is incorporated herein in its entirety by reference.

BACKGROUND OF THE INVENTION

1. Field of the Invention

The present invention relates to a semiconductor package module including vertical terminals, and more particularly, to a semiconductor package module including vertical terminals in which the vertical terminals are connected to increase the number of terminals, problems on bending of the terminals may be solved while in electrical connection, and resistance of electrical signals may be reduced.

2. Description of the Related Art

In general, a semiconductor package includes a semiconductor chip installed on a lower substrate or an upper substrate, a conductor which is a metal post functioning as a space bonded onto the semiconductor chip, a lead frame applying an electrical signal from the outside, a package housing molded by a sealing member, a heat radiation post exposed to the lower substrate or the upper substrate.

Figure 1A:
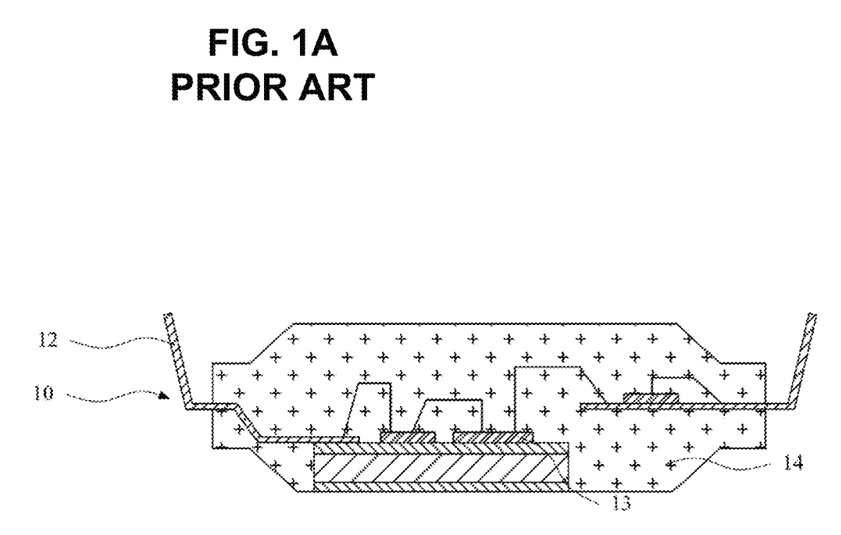
FIGS. 1A and 1B illustrate a semiconductor package module including vertical terminals according to a prior art.
Figure 1B:
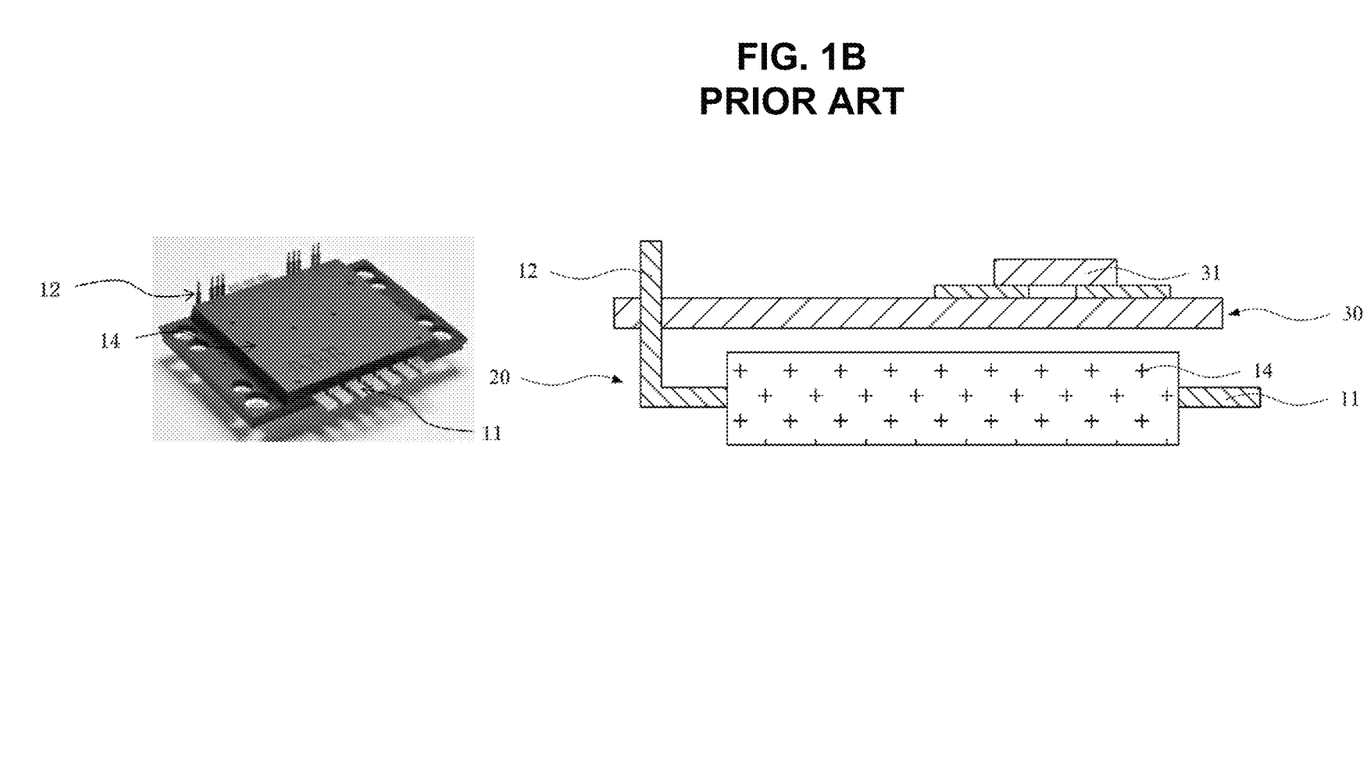

For example, referring to FIGS. 1A and 1B, in order to apply an electrical signal or electric power/voltage, semiconductor packages 10 and 20 molded by an epoxy mold compound (EMC) include horizontal terminals 11 and/or vertical terminals 12 electrically connected to semiconductor chips 13 installed within a package housing 14, wherein the terminals 11 and 12 particularly require to be electrically connected to a gate drive board 30 for driving a gate of the semiconductor chips 13.

Accordingly, at least one vertical terminal 12 is bent at a fixed angle of 90° through 130° to electrically connect to the gate drive board 30, wherein the gate drive board 30 is mainly formed of a PCB board and includes a gate driving semiconductor 31 installed on the PCB board. Also, the vertical terminal 12 is inserted into a via hole formed on the PCB board and is electrically connected to the PCB board through soldering.

However, the terminals have to come out to the side of the package housing 14 and the vertical terminals 12 are bent further while the vertical terminals 12 are bent and inserted to the PCB board disposed at the upper surface or the lower surface of the package housing 14. Accordingly, defects may cause and electrical reliability may be lowered.

Also, since the terminals 11 and 12 have to come out to the side of the package housing 14, there is a limit to increase the number of terminals. In addition, an electrical path through which the semiconductor chips 13 and a final PCB board are connected is lengthened and thereby, resistance may increase.

In this regard, there is a demand for the development of a technique that may increase the number of terminals, solve problems on bending of the terminals while in electrical connection, and reduce resistance of electrical signals through the terminals.

SUMMARY OF THE INVENTION

The present invention provides a semiconductor package module including vertical terminals in which the vertical terminals are connected to increase the number of terminals, problems on bending of the terminals may be solved while in electrical connection, and resistance of electrical signals may be reduced.

According to an aspect of the present invention, there is provided a semiconductor package module including vertical terminals including: a first semiconductor package including one or more substrates on which one or more semiconductor chips are installed, one or more metal bridges electrically connected to any one or more of the semiconductor chips and the substrates, one or more terminals electrically connected to any one or more of the semiconductor chips and the substrates, and a first housing covering the semiconductor chips and a part of the terminals, wherein one surface of the metal bridge is at least partly exposed to one surface of the first housing to enable electrical connection and one surface of the substrate is at least partly or entirely exposed to one surface or both surfaces of the first housing; and a second semiconductor package including a second housing stacked on the upper part or the lower part of the first semiconductor package, one or more terminal joining units electrically or structurally connected to one surface of the metal bridge exposed to one surface of the first housing, and the vertical terminals structurally connected to the terminal joining units, wherein the vertical terminals extend by penetrating the second housing.

Here, the second housing may be formed by insert molding using the vertical terminals.

A part of the side of the vertical terminal penetrating the second housing may be structurally joined to a penetration hole of the second housing.

A part of the side of the vertical terminal penetrating the second housing may be spaced apart from the inner circumferential surface of the penetration hole in the second housing by a distance of 5 µm through 5 mm.

The terminal joining unit may be disposed at the outer surface of the second housing.

The entire terminal joining unit may be embedded in the second housing and a joining surface of the terminal joining unit may be exposed to the outer surface of the second housing.

A part of the terminal joining unit may be disposed in the inside of the second housing and the rest of the terminal joining unit may be disposed at the outer surface of the second housing.

The second housing may include one or more penetration holes or non-penetration holes.

The second housing may include one or more block guide pins projected from at least one surface thereof.

A part of the first housing may be inserted to the penetration hole or the non-penetration holes of the second housing.

The first housing may include an engraved hole on one surface thereof.

The second housing may include one or more block guide pins projected from at least one surface thereof, the first housing may include an engraved hole on one surface thereof, and a part of the block guide pins in the second housing may be inserted to the engraved hole of the first housing.

The vertical terminals may be electrically or structurally connected to the metal bridges and then, a gap of at least 1

μm may be formed between one surface of the first housing and one surface of the second housing.

The vertical terminals may be electrically or structurally connected to the metal bridges and then, at least a part of one or more terminal joining units may be inserted and disposed in the first housing.

A material forming the first housing may be an EMC and a material forming the second housing may be PBT, PPS, or a thermosetting resin.

A material forming the first housing may be an EMC and a material forming the second housing may be PCB.

The second housing may include one or more insulating layers.

The second semiconductor package may include one or more metal patterns formed on one surface, both surfaces, or the inside of the second housing, and one or more semiconductor components installed on the metal patterns.

A part of one or more vertical terminals penetrating the second housing may be electrically or structurally connected to a part of one surface of the second housing by using a bonding material.

The second semiconductor package may be a gate drive board for driving a gate of the semiconductor chips in the first semiconductor package.

The semiconductor package module including vertical terminals may further include one or more third semiconductor packages on the upper surface or the lower surface of one or more second housings.

The third semiconductor package may include a third housing, one or more metal patterns formed on one surface, both surfaces, or the inside of the third housing, and one or more semiconductor components installed on the metal patterns One or more vertical terminals may penetrate the second housing and may be electrically joined to the metal patterns formed on one surface, both surfaces, or the inside of the third housing.

The substrate of the first semiconductor package may include one or more insulating layers.

The substrate of the first semiconductor package may include heat radiation posts formed on one surface thereof and thereby, heat generated while the semiconductor chip operates may be transmitted to the outside.

The substrate of the first semiconductor package may include a metal heat sink formed on one surface thereof and a heat conduction joining material interposed between the substrate and the metal heat sink so as to be joined to each other.

At least a part of one surface of the substrate in the first semiconductor package and a part of one surface of the second housing in the second semiconductor package may be joined to each other by being piled up one on another.

BRIEF DESCRIPTION OF THE DRAWINGS

The above and other features and advantages of the present invention will become more apparent by describing in detail exemplary embodiments thereof with reference to the attached drawings in which:

FIGS. 3A through 5B respectively illustrate a second semiconductor package structure of the semiconductor package module including vertical terminals of FIG. 2; and FIGS. 6A through 9C illustrate various application examples of the semiconductor package module including vertical terminals of FIG. 2.

DETAILED DESCRIPTION OF THE INVENTION

Hereinafter, embodiments of the present invention will be described in more detail with reference to the accompanying drawings.

A semiconductor package module including vertical terminals according to an embodiment of the present invention includes a first semiconductor package 110 and a second semiconductor package 120. The first semiconductor package 110 includes one or more substrates 112 on which one or more semiconductor chips 111 are installed, one or more metal bridges 113 electrically connected to the semiconductor chips 111 and/or the substrates 112, one or more terminals electrically connected to the semiconductor chips 111 and/or the substrates 112, and a first housing 115 covering the semiconductor chips 111 and a part of the terminals, wherein one surface of the metal bridge 113 is at least partly exposed to one surface of the first housing 115 to enable electrical connection and one surface of the substrate 112 is at least partly or entirely exposed to one surface or both surfaces of the first housing 115. The second semiconductor package 120 includes a second housing 121 stacked on the upper part or the lower part of the first semiconductor package 110, one or more terminal joining units 122 electrically and/or structurally connected to one surface of the metal bridge 113 exposed to one surface of the first housing 115, and vertical terminals 123 structurally connected to the terminal joining units 122, wherein the vertical terminals 123 extend by penetrating the second housing 121. In this regard, the number of terminals may increase by connecting the vertical terminals 123 to the upper surface and/or lower surface of the first housing 115, a problem on bending of the terminals may be solved while in electrical connection to the second semiconductor package 120, and resistance of electrical signals may be reduced through the terminals.

Hereinafter, the semiconductor package module including the vertical terminals described above will be described in more detail with reference to FIGS. 2 through 9C.

Figure 2:
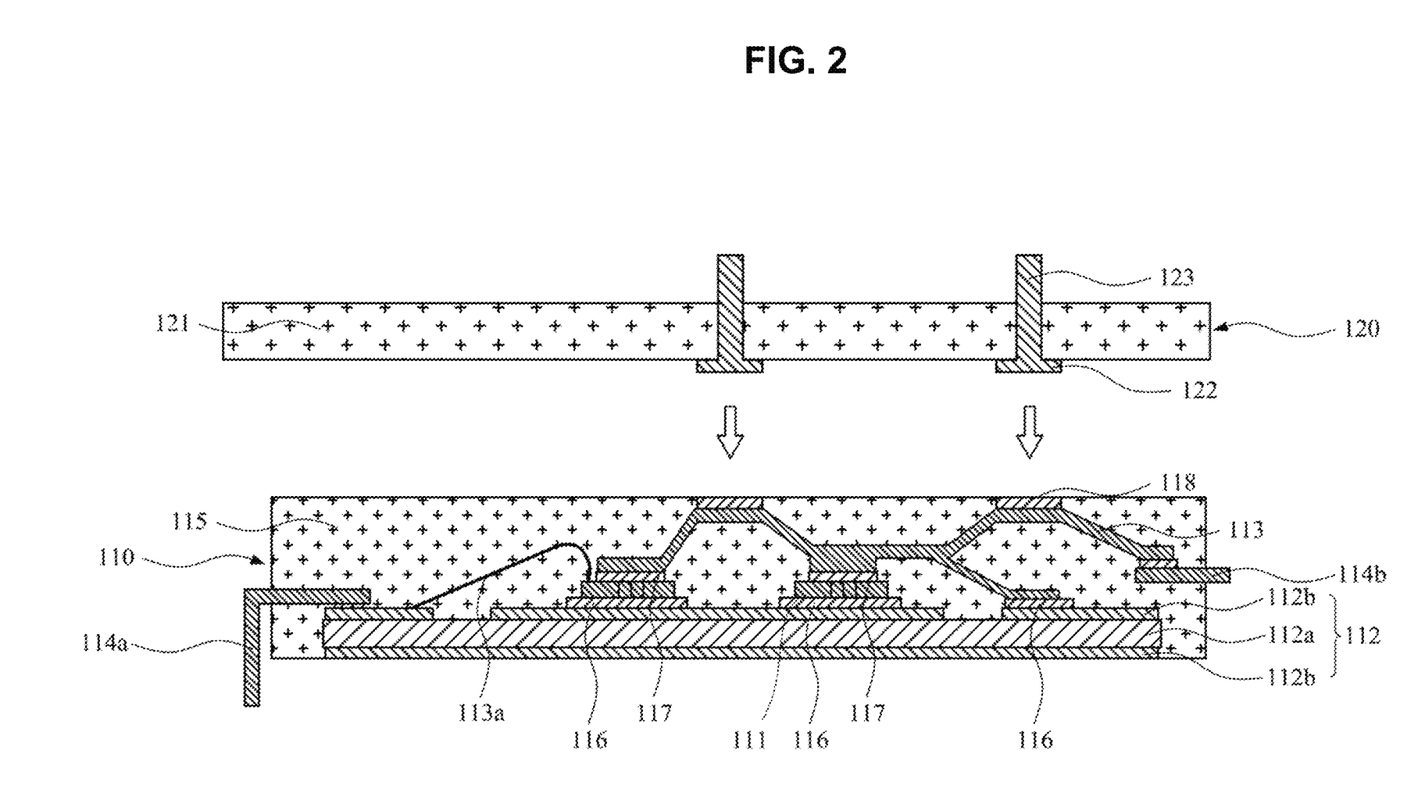
FIG. 2 illustrates a cross-sectional view of a semiconductor package module including vertical terminals according to an embodiment of the present invention.

First, referring to FIG. 2, the first semiconductor package 110 includes one or more substrates 112 on which one or more semiconductor chips 111 are installed by using a bonding layer 116 interposed therebetween, one or more metal bridges 113 electrically connected to the semiconductor chips 111 and/or the substrates 112 by using a bonding layer 117 interposed therebetween, one or more terminals electrically connected to the semiconductor chips 111 and/or the substrates 112, and the first housing 115 covering the semiconductor chips 111 and a part of the terminals to be electrically insulated.

Here, one surface of the metal bridge 113 is at least partly exposed to the upper surface and/or the lower surface of the first housing 115 to enable electrical connection. The substrate 112 may be formed as a single-sided substrate in such a way that one surface of the substrate 112 is at least partly or entirely exposed to one surface of the first housing 115 or the substrate 112 may be formed as a both-sided substrate in such a way that one surface of the substrate 112 is at least partly or entirely exposed to both surfaces of the first housing 115.

Here, exposure of at least a part for electrical connection includes not only physical or structural exposure but also connection using an adhesive or an electrical connecting medium.

The semiconductor chip 111 may be applied to an inverter, a converter, or an on board charger (OBC) which converts or controls power by using a power semiconductor chip having a power conversion function such as an Insulated Gate Bipolar Transistor (IGBT) or a Metal-Oxide-Semiconductor Field-Effect Transistor (MOSFET).

The substrate 112 may include at least one insulating layer 112a and at least one metal pattern 112b stacked on the upper surface and/or the lower surface of the insulating layer 112a, wherein the insulating layer 112a may be formed of a single material including $Al_2O_3$, AlN, $Si_3N_4$, or SiC or a composite material including at least one of $Al_2O_3$, AlN, $Si_3N_4$, and SiC.

The semiconductor chip 111 may be installed on the substrate 112 by using the bonding layer 116 interposed therebetween, may be electrically connected to a vertical terminal 114a through an electrical connecting means 113a, and/or may be electrically connected to a horizontal terminal 114b through the metal bridge 113. The vertical terminal 114a may be exposed to one side of the first housing 115 and bent in a vertical direction. The horizontal terminal 114b may be exposed to the other side of the first housing 115 and extended in a horizontal direction.

The material forming the first housing 115 may be an Epoxy Molding Compound (EMC).

The bonding layers 116 and 117 may include a solder containing Sn or a metal material containing Ag or Cu.

Next, referring to FIG. 2, the second semiconductor package 120 includes the second housing 121 stacked on the upper part or the lower part of the first semiconductor package 110, one or more terminal joining units 122 electrically or structurally connected to one surface of the metal bridge 113 exposed to one surface of the first housing 115 by using a bonding layer 118 interposed therebetween, and vertical terminals 123 structurally connected to the terminal joining units 122.

Here, the vertical terminals 123 extend by penetrating the second housing 121 in a vertical direction and thereby, an electrical signal may be applied to the semiconductor chip 111 through the metal bridge 113 from the outside.

A material forming the second housing 121 may be different from that of the first housing 115, for example, PBT, PPS, PCB, or a thermosetting resin.

Accordingly, in addition to the vertical terminal 114a and the horizontal terminal 114b respectively exposed to both sides of the first housing 115, the vertical terminals 123 may be electrically connected to the upper surface or the lower surface of the first housing 115. In this regard, the number of terminals may increase, a problem on bending of the terminals may be solved while in structural connection to the second semiconductor package 120, and resistance of electrical signals may be reduced through the terminals directly and vertically connected to the second semiconductor package 120.

Figure 3A:
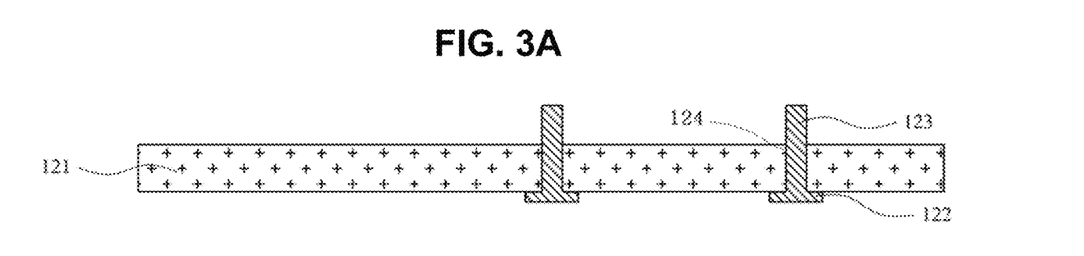
Figure 3B:
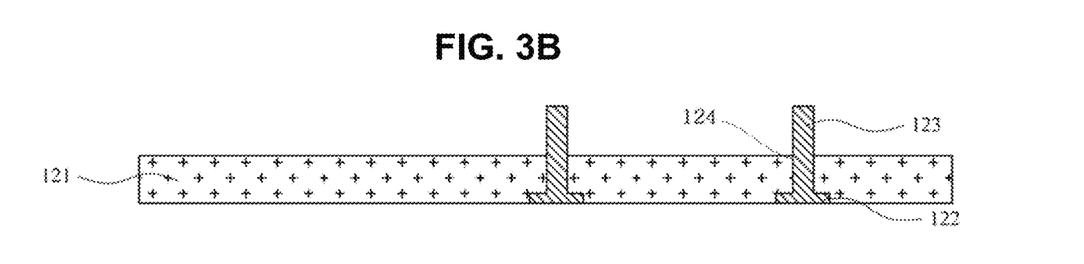
Figure 3C:
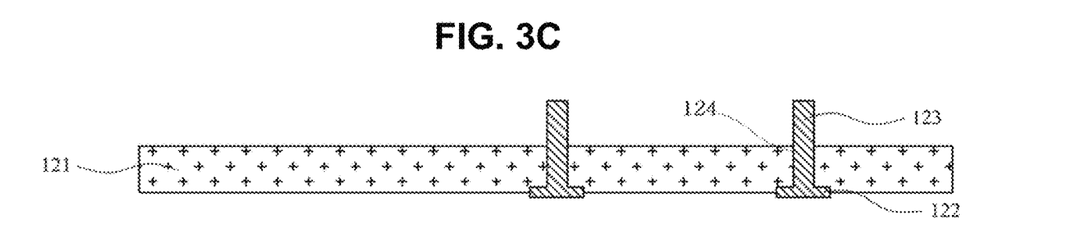

Since the second housing 121 is formed by insert molding using the vertical terminals 123, the terminal joining units 122 and the vertical terminals 123 may vertically penetrate and structurally join to the second housing 121 to be formed as one body as illustrated in FIGS. 3A, 3B and 3C. Also, a part of the side of the vertical terminal 123 may be structurally joined to a penetration hole 124 of the second housing 121 so that while the second semiconductor package 120 is combined to the first semiconductor package 110, the terminal joining unit 122 may be simultaneously connected to the metal bridge 113 by using the bonding layer 118 interposed therebetween without a separate electrical work. Accordingly, the efficiency of operation may be improved.

Figure 5A:
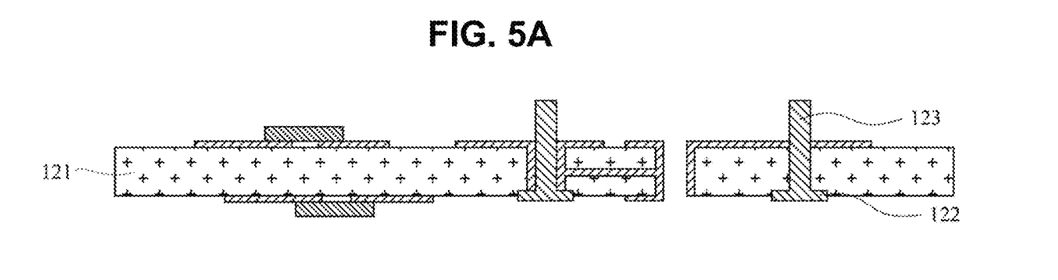
Figure 5B:
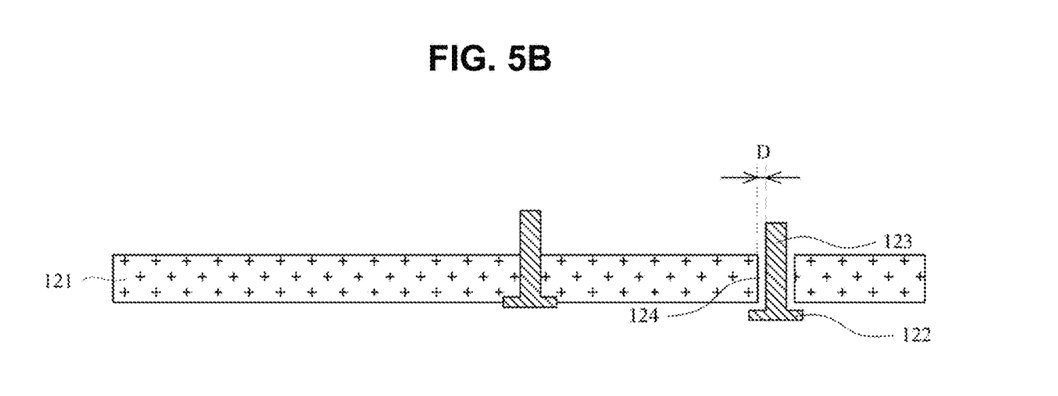

Also, as illustrated in FIG. 5B, the second semiconductor package 120 may be combined to the first semiconductor package 110 in such a way that the second housing 121 including the penetration hole 124 vertically penetrated thereinto is previously manufactured and then, the vertical terminals 123 are inserted to the penetration hole 124. Here, a part of the side of the vertical terminal 123 penetrating the second housing 121 is inserted and spaced apart from the inner circumferential surface of the penetration hole 124 by a distance D of 5 µm through 5 mm. Accordingly, stress occurring while in thermal expansion due to heat from the second housing 121 may not be directly transmitted to the vertical terminals 123 and thereby, joining reliability of the vertical terminals 123 may be improved.

The second housing 121 and the terminal joining unit 122 may be joined to each other in various structures. As illustrated in FIG. 3A, the entire terminal joining unit 122 may be completely exposed to the outer surface of the second housing 121. As illustrated in FIG. 3B, the entire terminal joining unit 122 may be embedded in the inside of the second housing 121 and a joining surface of the terminal joining unit 122 may be exposed to the outer surface of the second housing 121. As illustrated in FIG. 3C, a part of the terminal joining unit 122 may be disposed in the inside of the second housing 121 and the rest of the terminal joining unit 122 may be disposed at the outer surface of the second housing 121.

Figure 4A:
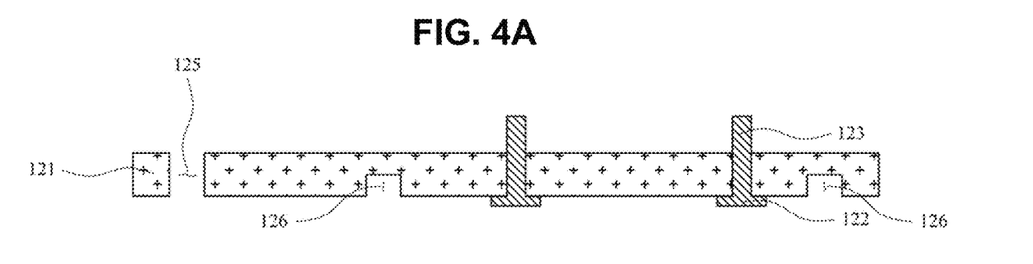
Figure 4B:
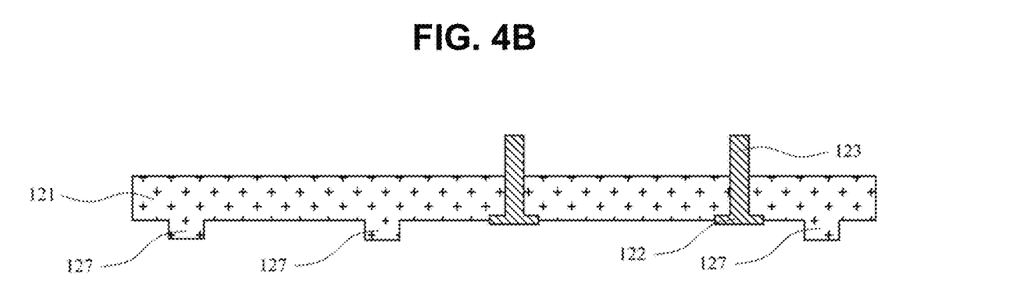

Referring to FIG. 4A, the second housing 121 may include one or more penetration holes 125 or non-penetration holes 126 to structurally join to the first housing 115. Referring to FIG. 4B, one or more block guide pins 127 may be projected from at least one surface of the second housing 121 to structurally join to the first housing 115.

Figure 7A:
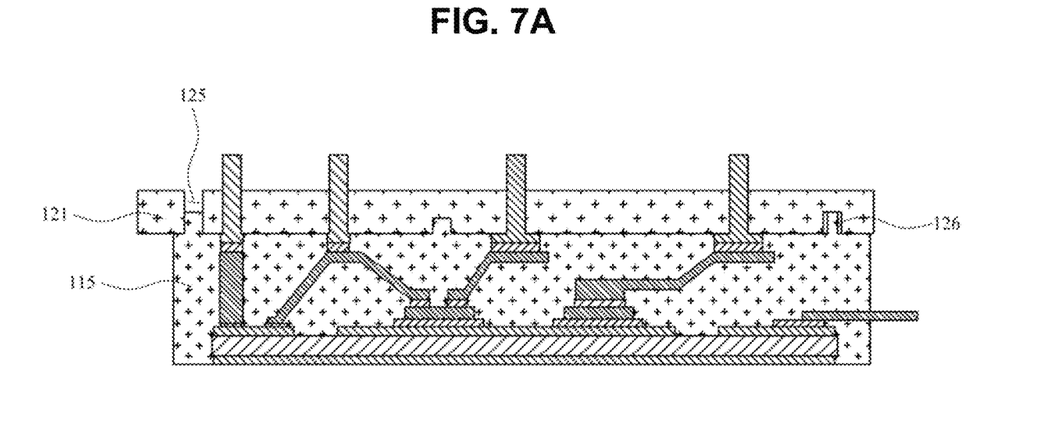

That is, as illustrated in FIG. 7A, a part of the first housing 115 may be projected toward the second housing 121 by a certain height so as to be inserted to the penetration holes 125 or the non-penetration holes 126 of the second housing 121.

Figure 7B:
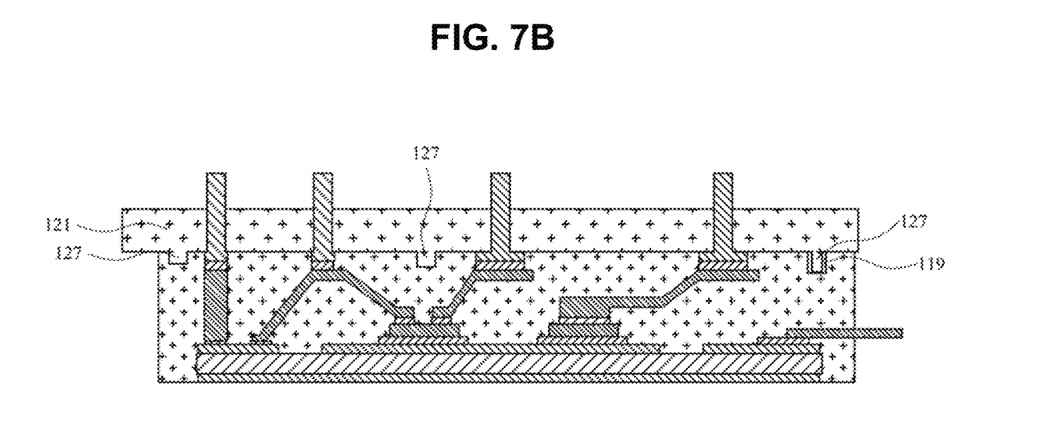

Also, as illustrated in FIG. 7B, an engraved hole 119 having a certain depth is formed on one surface of the first housing 115 and a part of the block guide pins 127 of the second housing 121 is inserted to the engraved hole 119 of the first housing 115. Accordingly, the first housing 115 and the second housing 121 may be structurally joined to each other.

Figure 6A:
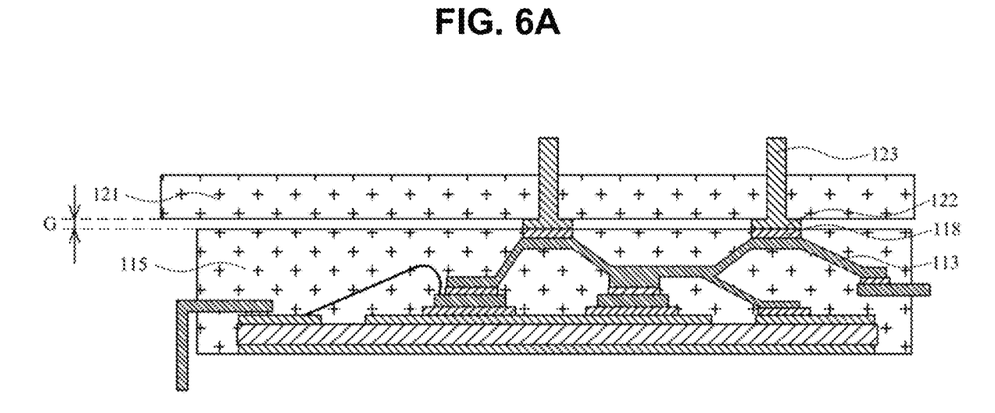

Referring to FIG. 6A, the vertical terminals 123 are electrically connected to the metal bridges 113 through the terminal joining units 122 and then, a gap G of at least 1 µm is formed between one surface of the first housing 115 and one surface of the second housing 121. Accordingly, the first housing 115 and the second housing 121 may not be physically and directly joined to each other and thus, thermal expansion stress occurring due to a difference in a thermal expansion coefficient of the first housing 115 and the second housing 121 minimizes an effect on electrical connection between the vertical terminals 123 and the metal bridges 113, wherein the first housing 115 and second housing 121 are formed of each different material. In this regard, joining reliability and electrical reliability may be improved.

For example, as described above, a material forming the first housing 115 may be EMC and a material forming the second housing 121 may be PBT, PPS, PCB, or a thermosetting resin. Accordingly, a coefficient of thermal expansion therebetween may be different from each other and thereby, the gap G may be formed between the first housing 115 and the second housing 121.

Figure 6B:
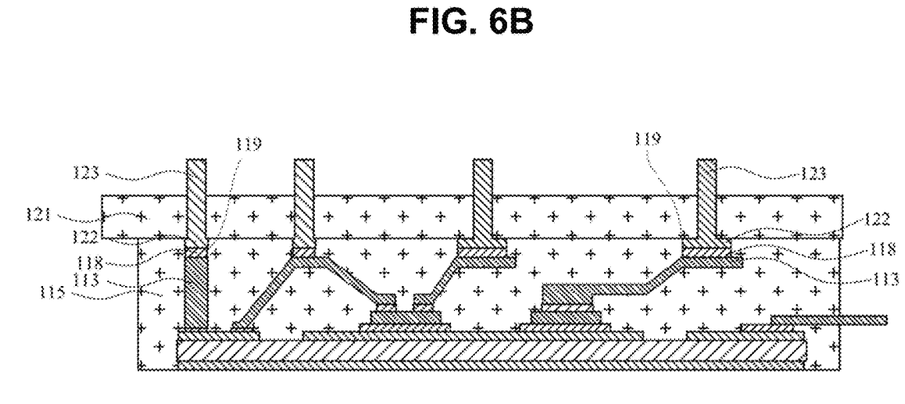

Referring to FIG. 6B, the vertical terminals 123 are electrically connected to the metal bridges 113 and then, at least a part of one or more terminal joining units 122 is inserted and disposed in the first housing 115 through the engraved holes 119. Accordingly, joining strength between the metal bridges 113 and the vertical terminals 123 may increase and electrical reliability may be secured.

Figure 8A:
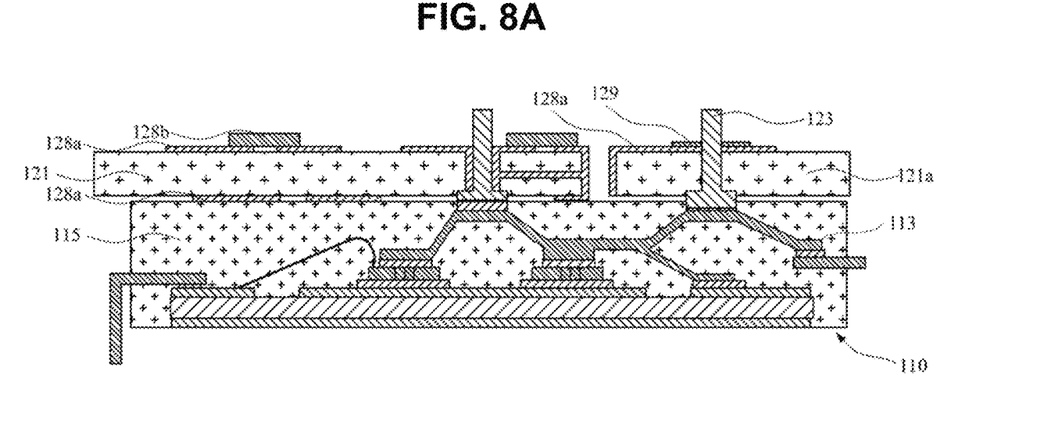

Also, referring to FIG. 8A, the second semiconductor package 120 may include one or more metal patterns 128a formed on one surface, both surfaces, or the inside of the second housing 121, and one or more semiconductor components 128b installed on the metal patterns 128a. Also, the second housing 121 may include one or more insulating layers 121a.

As illustrated in FIG. 8A, a part of one or more vertical terminals 123 penetrating the second housing 121 is electrically or structurally connected to a part of one surface of the second housing 121 by using a bonding material 129. Accordingly, joining strength between the vertical terminals 123 and the second housing 121 may increase.

Here, the second semiconductor package 120 may be a gate drive board for driving a gate of the semiconductor chip 111 of the first semiconductor package 110 through the vertical terminals 123 electrically connected to the metal bridges 113.

Figure 8B:
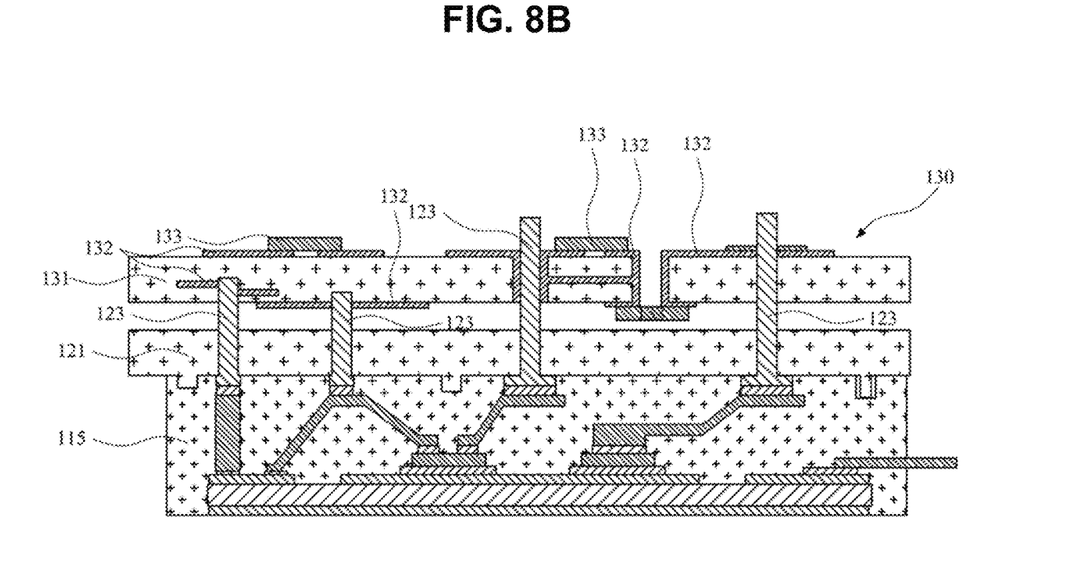

Also, as illustrated in FIG. 8B, one or more third semiconductor packages 130 may be additionally stacked on the upper surface or the lower surface of one or more second housings 121, wherein the third semiconductor package 130 may include a third housing 131, one or more metal patterns 132 formed on one surface, both surfaces, or the inside of the third housing 131, and one or more semiconductor components 133 installed on the metal patterns 132.

Here, one or more vertical terminals 123 may penetrate the second housing 121 and may be electrically joined to the metal patterns 132 formed on one surface, both surfaces, or the inside of the third housing 131.

Figure 9A:
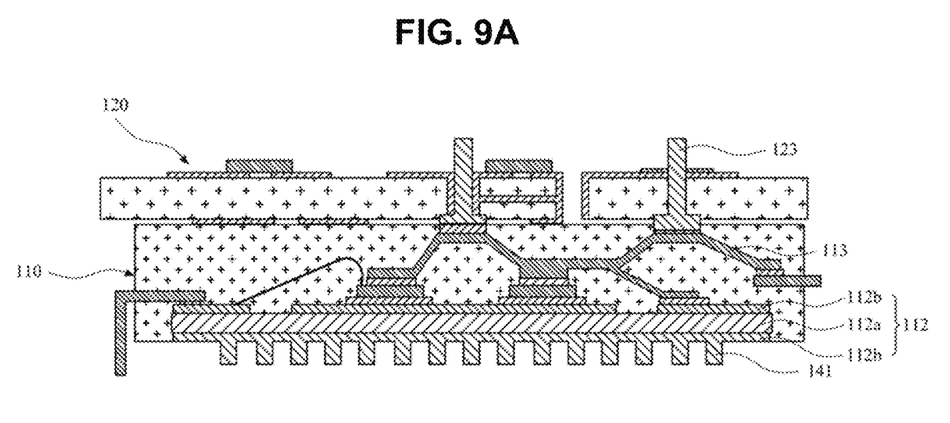

Also, referring to FIG. 9A, heat radiation posts 141 are formed on one surface of the substrate 112 in the first semiconductor package 110 and thereby, heat generated while the semiconductor chip 111 operates may be transmitted to the outside. Accordingly, electrical reliability may be secured.

Figure 9B:
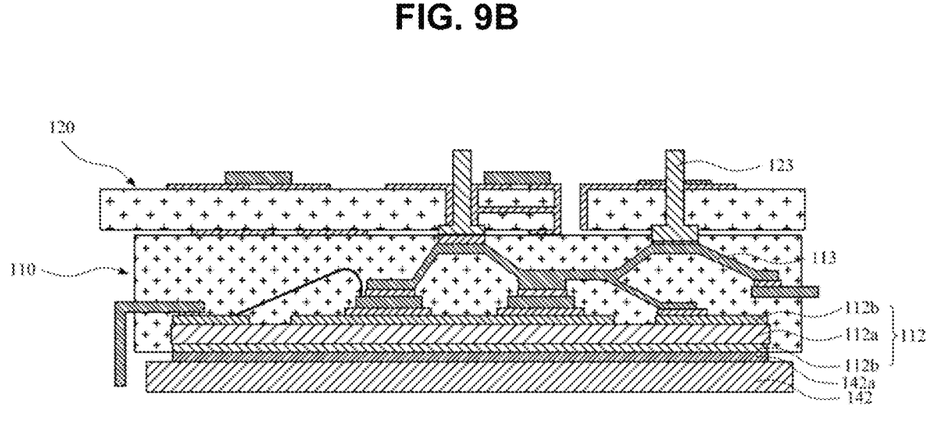

Referring to FIG. 9B, a metal heat sink 142 is bonded onto one surface of the substrate 112 in the first semiconductor package 110 and a heat conduction joining material 142a may be interposed between the substrate 112 and the metal heat sink 142. Accordingly, the substrate 112 and the metal heat sink 142 may be joined to each other and thus, electrical reliability may be secured.

Figure 9C:
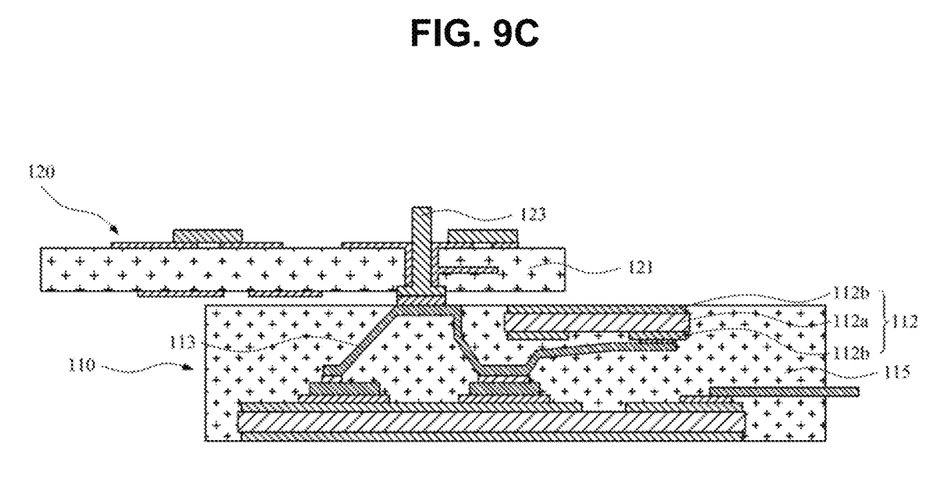

Referring to FIG. 9C, at least a part of one surface of the substrate 112 having a both-sided substrate structure in the first semiconductor package 110 and a part of one surface of the second housing 121 in the second semiconductor package 120 are joined to each other by being piled up one on another. Accordingly, the first semiconductor package 110 may not be entirely covered, a vertical terminal structure may be applied to the both-sided substrate structure, and heat radiation may be efficiently performed through exposed substrate regions of the first semiconductor package 110.

According to the semiconductor package module including the vertical terminals described above, the number of terminals may increase by electrically connecting the vertical terminals to the upper surface or the lower surface of the first housing, in addition to the vertical terminals and the horizontal terminals each exposed to both sides of the first housing, a problem on bending of the terminals may be solved while in structural connection to the second semiconductor package, and resistance of electrical signals may be reduced through the terminals directly and vertically connected to the second semiconductor package.

According to the present invention, the number of terminals may increase by electrically connecting the vertical terminals to the upper surface or the lower surface of the first housing, in addition to the vertical terminals and the horizontal terminals each exposed to both sides of the first housing, a problem on bending of the terminals may be solved while in structural connection to the second semiconductor package, and resistance of electrical signals may be reduced through the terminals directly and vertically connected to the second semiconductor package.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package module comprising vertical terminals comprising:
   a first semiconductor package comprising one or more substrates on which one or more semiconductor chips are installed, one or more metal bridges electrically connected to any one or more of the semiconductor chips and the substrates, one or more terminals electrically connected to any one or more of the semiconductor chips and the substrates, and a first housing covering the semiconductor chips and a part of the terminals, wherein one surface of the metal bridge is at least partly exposed to one surface of the first housing to enable electrical connection and one surface of the substrate is at least partly or entirely exposed to one surface or both surfaces of the first housing; and
   a second semiconductor package comprising a second housing stacked on the upper part or the lower part of the first semiconductor package, one or more terminal joining units electrically or structurally connected to one surface of the metal bridge exposed to one surface of the first housing, and the vertical terminals structurally connected to the terminal joining units, wherein the vertical terminals extend by penetrating the second housing.

2. The semiconductor package module comprising vertical terminals of claim 1, wherein the second housing is formed by insert molding using the vertical terminals.

3. The semiconductor package module comprising vertical terminals of claim 1, wherein a part of the side of the vertical terminal penetrating the second housing is structurally joined to a penetration hole of the second housing.

4. The semiconductor package module comprising vertical terminals of claim 1, wherein a part of the side of the vertical terminal penetrating the second housing is spaced apart from the inner circumferential surface of the penetration hole in the second housing by a distance of 5 μm through 5 mm.

5. The semiconductor package module comprising vertical terminals of claim 1, wherein the terminal joining unit is disposed at the outer surface of the second housing.

6. The semiconductor package module comprising vertical terminals of claim 1, wherein the entire terminal joining unit is embedded in the second housing and a joining surface of the terminal joining unit is exposed to the outer surface of the second housing.

7. The semiconductor package module comprising vertical terminals of claim 1, wherein a part of the terminal joining unit is disposed in the inside of the second housing and the rest of the terminal joining unit is disposed at the outer surface of the second housing.

8. The semiconductor package module comprising vertical terminals of claim 1, wherein the second housing comprises one or more penetration holes or non-penetration holes.

9. The semiconductor package module comprising vertical terminals of claim 1, wherein the second housing comprises one or more block guide pins projected from at least one surface thereof.

10. The semiconductor package module comprising vertical terminals of claim 1, wherein the first housing comprises an engraved hole on one surface thereof.

11. The semiconductor package module comprising vertical terminals of claim 1, wherein the vertical terminals are electrically or structurally connected to the metal bridges and then, a gap of at least 1 μm is formed between one surface of the first housing and one surface of the second housing.

12. The semiconductor package module comprising vertical terminals of claim 1, wherein the vertical terminals are electrically or structurally connected to the metal bridges and then, at least a part of one or more terminal joining units is inserted and disposed in the first housing.

13. The semiconductor package module comprising vertical terminals of claim 1, wherein the second semiconductor package comprises one or more metal patterns formed on one surface, both surfaces, or the inside of the second housing, and one or more semiconductor components installed on the metal patterns.

14. The semiconductor package module comprising vertical terminals of claim 1, wherein a part of one or more vertical terminals penetrating the second housing is electrically or structurally connected to a part of one surface of the second housing by using a bonding material.

15. The semiconductor package module comprising vertical terminals of claim 1, further comprising one or more third semiconductor packages additionally stacked on the upper surface or the lower surface of one or more second housings.

16. The semiconductor package module comprising vertical terminals of claim 15, wherein the third semiconductor package comprises a third housing, one or more metal patterns formed on one surface, both surfaces, or the inside of the third housing, and one or more semiconductor components installed on the metal patterns.

17. The semiconductor package module comprising vertical terminals of claim 15, wherein one or more vertical terminals penetrate the second housing and are electrically joined to the metal patterns formed on one surface, both surfaces, or the inside of the third housing.

18. The semiconductor package module comprising vertical terminals of claim 1, wherein the substrate of the first semiconductor package comprises heat radiation posts formed on one surface thereof and heat generated while the semiconductor chip operates is transmitted to the outside.

19. The semiconductor package module comprising vertical terminals of claim 1, wherein the substrate of the first semiconductor package comprises a metal heat sink formed on one surface thereof and a heat conduction joining material interposed between the substrate and the metal heat sink so as to be joined to each other.

20. The semiconductor package module comprising vertical terminals of claim 1, wherein at least a part of one surface of the substrate in the first semiconductor package and a part of one surface of the second housing in the second semiconductor package are joined to each other by being piled up one on another.

* * * * *